(12) United States Patent
Hsue et al.

(10) Patent No.: US 6,603,167 B2
(45) Date of Patent: Aug. 5, 2003

(54) CAPACITOR WITH LOWER ELECTRODE LOCATED AT THE SAME LEVEL AS AN INTERCONNECT LINE

(75) Inventors: Chen-Chiu Hsue, Hsinchu (TW); Shyh-Dar Lee, Hsinchu Hsien (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 0 days.

(21) Appl. No.: 10/093,531

(22) Filed: Mar. 11, 2002

(65) Prior Publication Data

US 2002/0190301 A1 Dec. 19, 2002

Related U.S. Application Data

(63) Continuation-in-part of application No. 09/881,101, filed on Jun. 15, 2001, now Pat. No. 6,358,792.
(51) Int. Cl.[7] .................. H01L 31/119; H01L 23/48
(52) U.S. Cl. .................. 257/301; 257/750; 257/758; 257/774
(58) Field of Search .................. 257/301, 750, 257/758, 774, 752, 773, 29.343, 29.344

(56) References Cited

U.S. PATENT DOCUMENTS

| | | | |
|---|---|---|---|
| 5,086,370 A | | 2/1992 | Yasaitis .................. 361/313 |
| 5,479,316 A | | 12/1995 | Smrtic et al. .................. 287/532 |
| 6,100,574 A | * | 8/2000 | Norstrom et al. .................. 257/532 |
| 6,114,199 A | * | 9/2000 | Isobe et al. .................. 438/240 |
| 6,271,084 B1 | * | 8/2001 | Tu et al. .................. 438/253 |

* cited by examiner

Primary Examiner—Jasmine J B Clark
(74) Attorney, Agent, or Firm—Birch, Stewart, Kolasch & Birch, LLP

(57) ABSTRACT

A capacitor in which the lower electrode and an interconnect line are located at the same level. The capacitor includes a first conductive line and a second conductive line on a substrate located at the same level, wherein the second conductive line defines a capacitor region and is used as a lower electrode of the capacitor; an insulating layer on the substrate, the first conductive line, and the second conductive line; and a third conductive line on the insulating layer in the capacitor region such that the third conductive line is used as an upper electrode of the capacitor. Since the lower electrode and an interconnect line can be in-situ (concurrently) formed to be located at the same level, one mask can be omitted compared with the conventional method, and production costs can be reduced.

15 Claims, 5 Drawing Sheets

CAPACITOR WITH LOWER ELECTRODE LOCATED AT THE SAME LEVEL AS AN INTERCONNECT LINE

This application is a continuation-in-part of application Ser. No. 09/881,101 filed Jun. 15, 2001, now U.S. Pat. No. 6,358,792.

BACKGROUND OF THE INVENTION

1. Field of the Invention

The present invention relates to a capacitor, and more particularly to a capacitor in which the lower electrode and an interconnect line are located at the same level.

2. Description of the Prior Art

Capacitors are integrated in various integrated circuits. For example, capacitors can be used as decoupling capacitors to provide improved voltage regulation and noise immunity for power distribution. Capacitors also have wide applications in analog/logic, analog-to-digital, mixed signal, radio frequency circuits and so on.

Refer to FIGS. 1a to 1f, which are cross-sectional views illustrating the process flow of fabricating a metal capacitor in an intermetal dielectric layer according to conventional process. Referring to FIG. 1a, a semiconductor substrate 100 including a MOS transistor (not shown) is provided. A plurality of first level metal lines 120 and 121 are formed on the substrate 100, and a first intermetal dielectric layer 110 is formed on the substrate 100 and the metal lines 120 and 121. A first resist pattern 140 is formed on the first intermetal dielectric layer 110. The first intermetal dielectric layer 110 is then patterned by photolithography and etching using the first resist pattern 140 as a mask to form a via hole. Metal is then filled into the via hole to form a first plug 150, and the first resist layer 140 is removed.

Next, referring to FIG. 1b, a metal layer 160, an insulating layer 170, and a metal layer 180 are successively formed on the entire surface of the first intermetal dielectric layer 110 and the first plug 150. A second resist pattern 190 is formed on the metal layer 180. The second resist pattern 190 defines a region for forming a metal capacitor in the future, which is called a capacitor region 130. Then, the metal layer 160, the insulating layer 170, and the metal layer 180 are patterned by photolithography and etching using the second resist pattern 190 as a mask to define a metal capacitor 200 which includes a lower electrode 160', an insulating layer 170', and an upper electrode 180' as shown in FIG. 1c.

Next, referring to FIG. 1d, a second intermetal dielectric layer 210 is formed on the metal capacitor 200 and the first intermetal dielectric layer 110.

Next, referring to FIG. 1e, a third resist pattern 220 is formed on the second intermetal dielectric layer 210. The second intermetal dielectric layer 210 is then patterned by photolithography and etching by using the third resist pattern 220 as a mask to form a via hole in the capacitor region 130 reaching the upper electrode 180' and a via hole reaching first level metal line 120, which are then filled with metal to form a second plug 230 and a third plug 240.

Finally, referring to FIG. 1f, second level metal lines 250 and 251 are formed on the plugs 230 and 240 respectively for electrical connection.

The conventional method for fabricating a metal capacitor in an intermetal dielectric layer has the following disadvantages:

(1) Two masks are needed to fabricate a metal capacitor. That is to say, one mask is needed when the plug 150 is defined and the other mask is needed when the metal capacitor is patterned. Thus, costs are high.

(2) Since the cross-sectional area of the plug 150 is small, when the plug 150 is defined, etching is very difficult to control, complicating the process.

(3) When the plugs 230 and 240 are concurrently defined, since the etching heights for the two plugs differ a lot, etching is difficult to conduct, complicating the process.

(4) Since the metal layer 160, the insulating layer 170, and the metal layer 180 for forming the metal capacitor are formed on the entire surface, production costs are very high.

(5) When the metal layer 160, the insulating layer 170, and the metal layer 180 are etched to form the metal capacitor, it is very easy to cause damage on the edge portion of the metal capacitor. Thus, yield is decreased.

SUMMARY OF THE INVENTION

The object of the present invention is to solve the above-mentioned problems and to provide a capacitor in which the lower electrode and an interconnect line are located at the same level. The lower electrode and the interconnect line can be in-situ (concurrently) formed. Thus, one mask can be omitted compared with the conventional method, and production costs can be reduced.

To achieve the above-mentioned object, the capacitor of the present invention includes a first conductive line and a second conductive line on a substrate located at the same level, wherein the second conductive line defines a capacitor region and is used as a lower electrode of the capacitor; an insulating layer on the substrate, the first conductive line, and the second conductive line; and a third conductive line on the insulating layer in the capacitor region such that the third conductive line is used as an upper electrode of the capacitor.

Above the upper electrode of the capacitor, the capacitor of the present invention can further includes a dielectric layer on the upper electrode and the insulating layer, wherein the dielectric layer has a first via hole reaching the first conductive line and a second via hole reaching the upper electrode; a first metal plug filled in the first via hole; a second metal plug filled in the second via hole; a fourth conductive line on the first plug; and a fifth conductive line on the second plug, wherein the fourth and the fifth conductive lines are located at the same level.

The main difference between the capacitor of the present invention and conventional one resides in the fact that, in the present invention, the lower electrode and an interconnect line are located at the same level. That is to say, the lower electrode and the interconnect line can be in-situ (concurrently) formed. Thus, one mask can be omitted compared with the conventional capacitor, and a step of photolithography and etching can be omitted.

In the present invention, production costs are decreased, process complexity is decreased, yield is enhanced, and the object of minaturizing integrated circuits is achieved.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and of the scope of the invention will become apparent to those skilled in the art from this detailed description.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENTS

Figure 9:
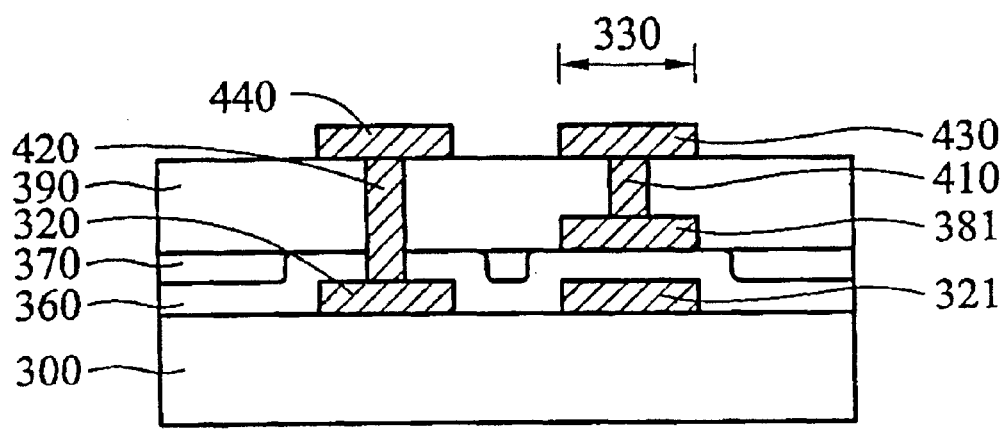

FIG. 9 is an cross-section of a capacitor according to a preferred embodiment of the present invention. Symbol 300 refers to a semiconductor substrate. A first conductive line 320 and a second conductive line 321 are is formed on the substrate 300. It should be noted that the first conductive line 320 and the second conductive line 321 are located at the same level. The second conductive line defines a capacitor region 330 and is used as a lower electrode of the capacitor.

An insulating layer 360 is formed on the substrate 300, the first conductive line 320, and the second conductive line 321. A third conductive line 381 is formed on the insulating layer 360 in the capacitor region 330 such that the third conductive line 381 is used as an upper electrode of the capacitor. A dielectric layer 390 is formed on the upper electrode 381 and the insulating layer 360. The dielectric layer 390 has a first via hole reaching the first conductive line 320, and a first metal plug 420 is filled in the first via hole. The dielectric layer 390 also has a second via hole reaching the upper electrode 381, and a second metal plug 410 is filled in the second via hole. A fourth conductive line 440 is formed on the first plug 420, and a fifth conductive line 430 is formed on the second plug 410. The fourth and the fifth conductive lines 440 and 430 are located at the same level.

Refer to FIGS. 2 to 9, which are cross-sectional views illustrating the process flow of fabricating the capacitor shown in FIG. 9 according to a preferred embodiment of the present invention.

Figure 1A:
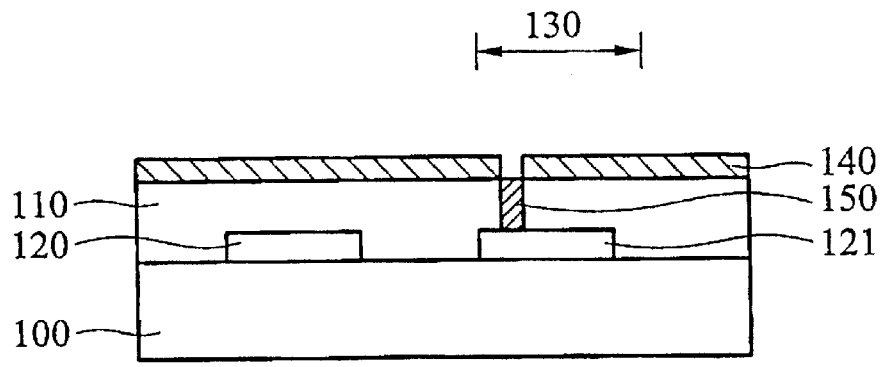
FIGS. 1a to 1f are cross-sectional views illustrating the process flow of fabricating a capacitor according to a conventional method.
Figure 1B:
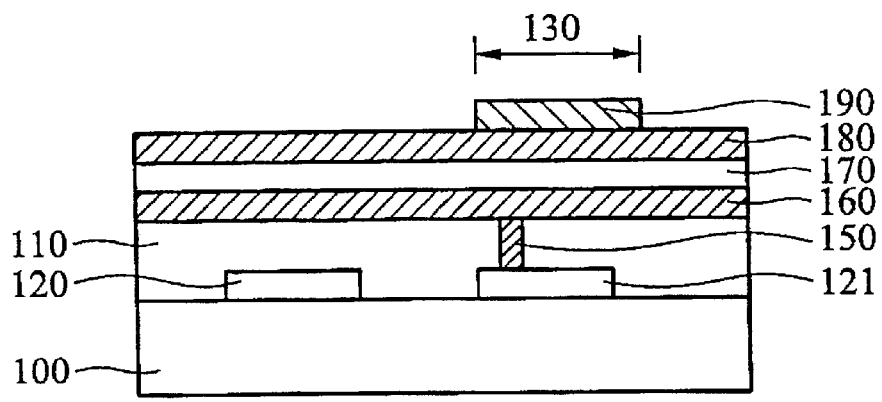
Figure 1C:
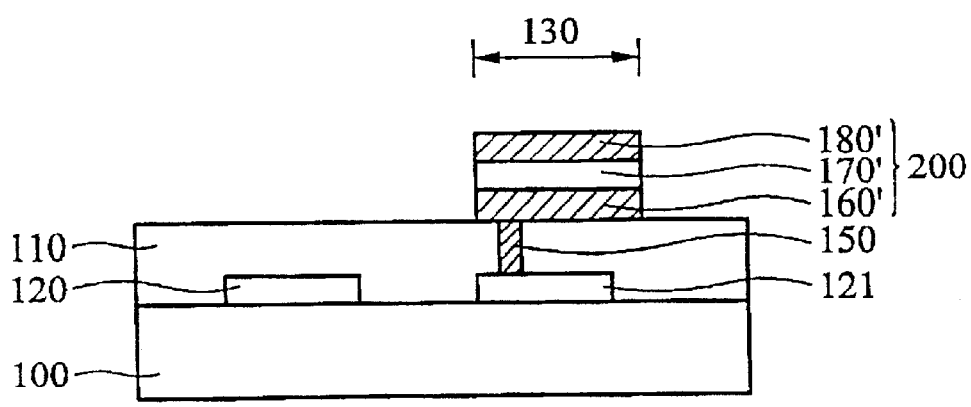
Figure 1D:
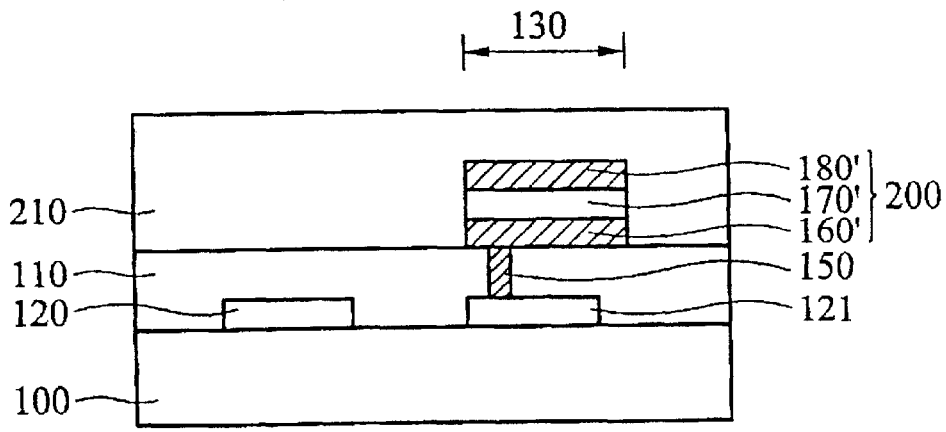
Figure 1E:
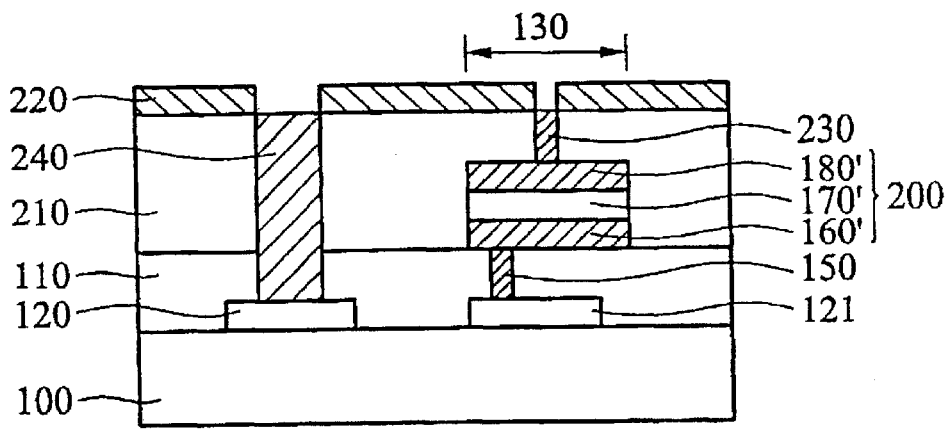
Figure 1F:
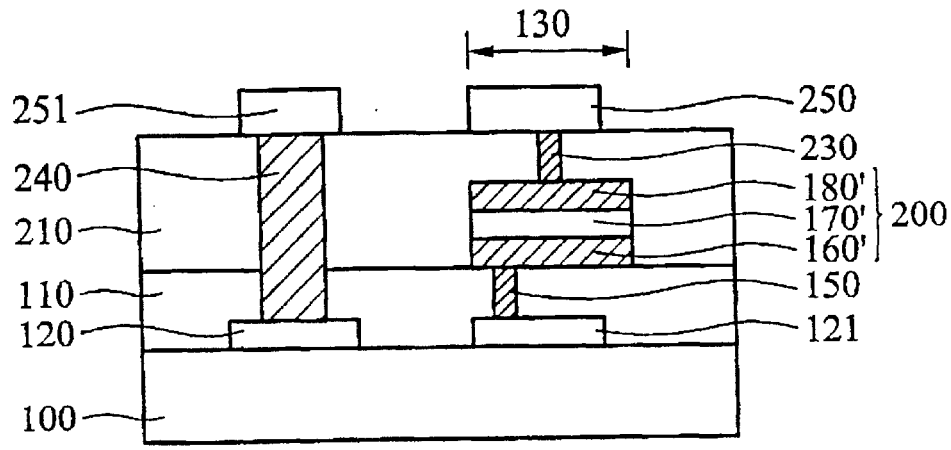
Figure 2:
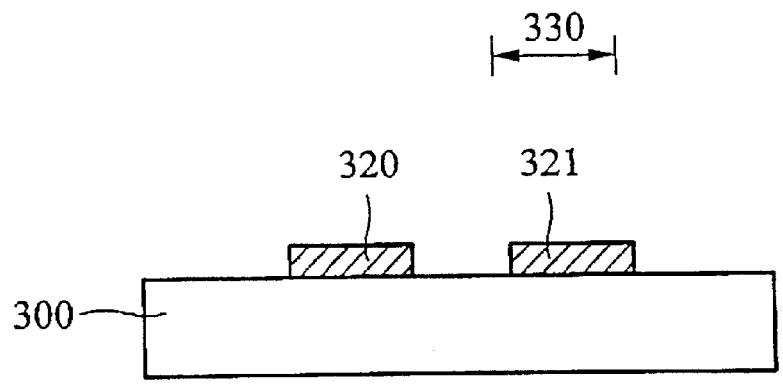
FIGS. 2 to 9 are cross-sectional views illustrating the process flow of fabricating a capacitor according to a preferred embodiment of the present invention.

Referring to FIG. 2, a first level conductive layer (not shown) is formed on a substrate 300. Then, the first level conductive layer is patterned to concurrently form a first conductive line 320 and a second conductive line 321. The second conductive line 321 defines a capacitor region 330 and is used as a lower electrode of a capacitor. The first and second conductive lines 320 and 321 can be metal such as aluminum, copper, or an aluminum alloy, or can be polysilicon, having a thickness of 4000 Å to 6000 Å.

Figure 3:
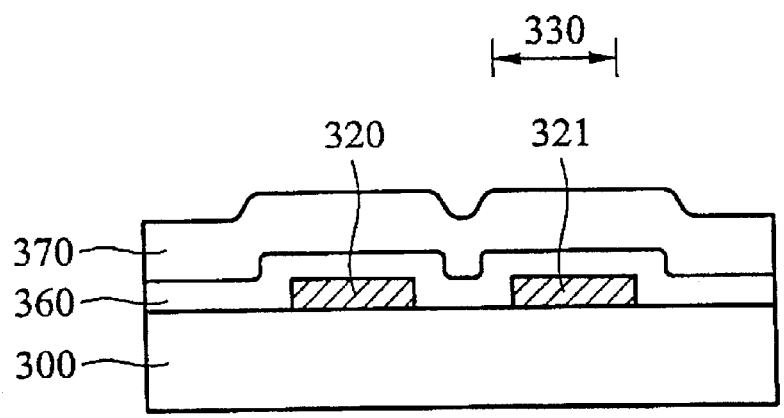

Subsequently, referring to FIG. 3, an insulating layer 360 is formed conformably on the substrate 300, the first conductive line 320, and the second conductive line 321. Then, a first dielectric layer 370 is formed on the insulating layer 360. The insulating layer 360 can be made of a material of SiN, SiON, SiC, $TaO_2$, $TiO_2$, $ZrO_2$, $HfO_2$, or $Al_2O_3$ having a thickness of 100 Å to 1500 Å formed by chemical vapor deposition (CVD). The first dielectric layer 370 can be a silicon oxide layer having a thickness of 4000 Å to 10000 Å formed by CVD, preferably HDPCVD (high density plasma CVD).

Figure 4:
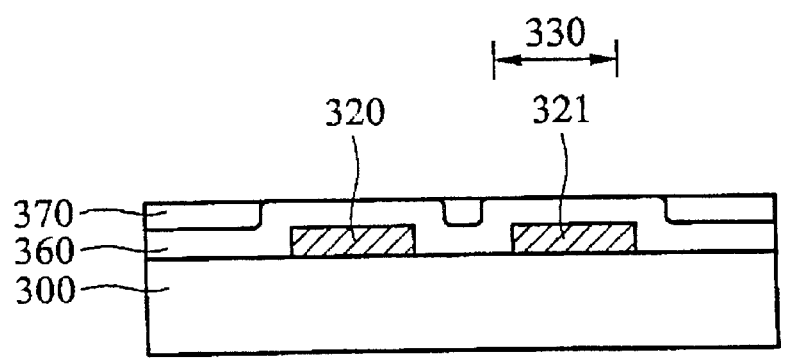

Subsequently, referring to FIG. 4, the first dielectric layer 370 is subjected to planarization treatment such that the planarization treatment ends up to the insulating layer 360. The planarization treatment can be chemical mechanical polishing (CMP).

Figure 5:
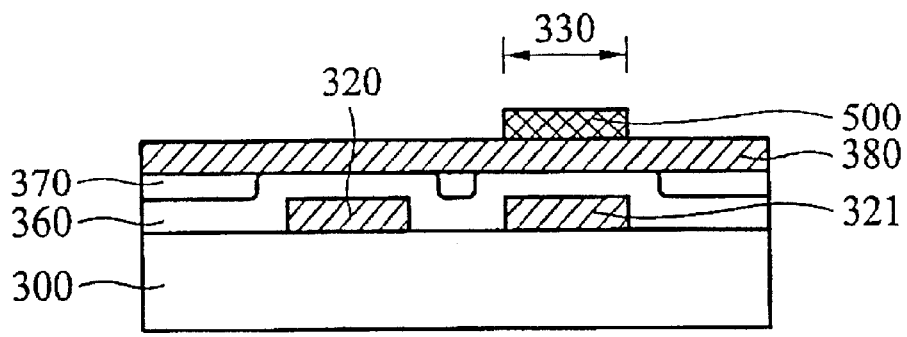

Subsequently, referring to FIG. 5, a conductive layer 380 is formed on the first dielectric layer 370 and the insulating layer 360. The conductive layer 380 can be metal such as Ti, TiN, Ta, TaN, Al, or AlCu, or can be polysilicon, having a thickness of 100 Å to 2500 Å. Then, a first photoresist pattern 500 is formed on the conductive layer 380 in the capacitor region 330.

Figure 6:
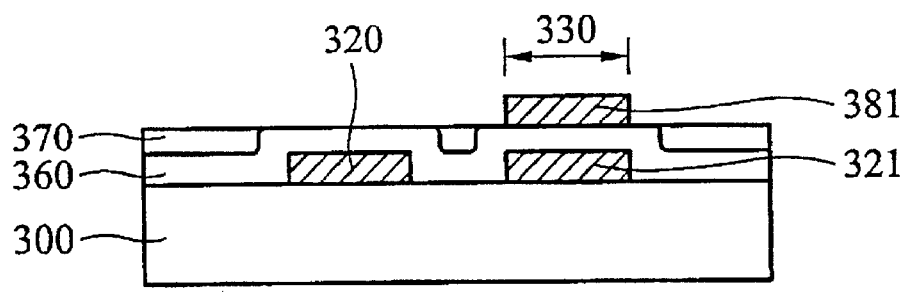

Subsequently, referring to FIG. 6, the conductive layer 380 is patterned by photolithography and etching using the first photoresist pattern 500 as a mask to form a third conductive line 381 on the insulating layer 360, such that the third conductive line 381 is used as an upper electrode of a capacitor. Thus, the capacitor of the present invention is formed, which is constituted by the second conductive line 321 (serving as the lower electrode), the insulating layer 360, and the third conductive line 381 (serving as the upper electrode).

Figure 7:
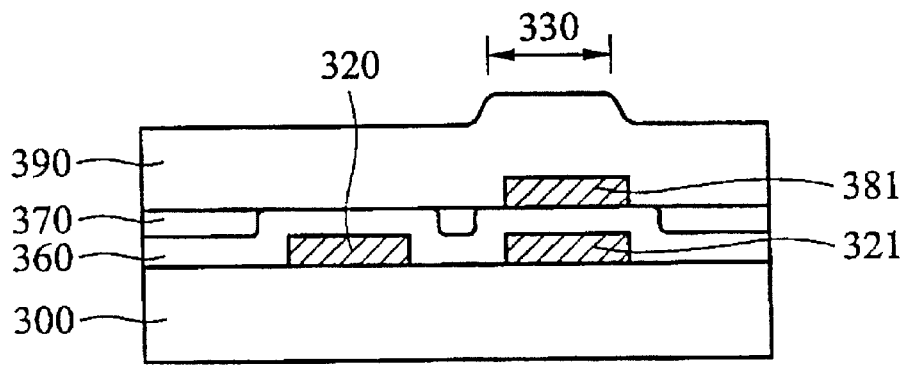

Subsequently, referring to FIG. 7, a second dielectric layer 390 is formed on the upper electrode 381, the insulating layer 360, and the first dielectric layer 370. The second dielectric layer 390 can be a silicon oxide layer having a thickness of 4000 Å to 10000 Å formed by CVD, preferably PECVD (plasma-enhanced CVD).

Figure 8:
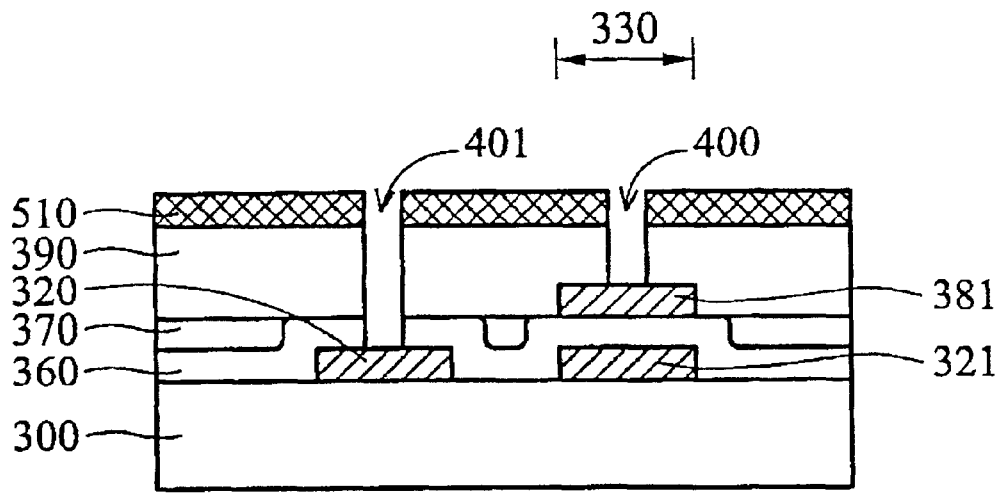

Subsequently, referring to FIG. 8, the second dielectric layer 390 can be subjected to CMP treatment to planarize the surface of the second dielectric layer 390. Then, a second photoresist pattern 510 is formed on the second dielectric layer 390. Then, the second dielectric layer 390 is patterned by photolithography and etching using the second photoresist pattern 510 as a mask to form a first via hole 401 reaching the first conductive line 320 and a second via hole 400 reaching the upper electrode 381.

Subsequently, referring to FIG. 9, metal is filled into the first and the second via holes 401 and 400 to form first and second plugs 420 and 410 respectively. For example, tungsten can be directly filled into the first and the second via holes 401 and 400. Or, alternatively, a barrier layer (not shown) can be first formed on interior walls of the first and the second via holes 401 and 400. Then, tungsten is deposited on the barrier layer to fill tungsten into the first and the second via holes 401 and 400. The barrier layer can be Ti/TiN or TiW formed by sputtering. Then, a second level metal layer (not shown) is formed on the second dielectric layer 390, the first plug 420, and the second plug 410. Then, the second level metal layer is patterned to form a fourth conductive line 440 on the first plug 420 and a fifth conductive line 430 on the second plug 410 for electrical connection. The fourth and fifth conductive lines can be made of aluminum, copper, or an aluminum alloy having a thickness of 4000 Å to 6000 Å.

The main difference between the capacitor of the present invention and the conventional capacitor resides in the fact that in the present invention, the lower electrode 321 and an interconnect line 320 are located at the same level. That is to say, the lower electrode 321 and the interconnect line 320 can be in-situ (concurrently) formed. Thus, one mask can be omitted compared with the conventional method, and thus a step of photolithography and etching can be omitted.

In conclusion, the method for fabricating a capacitor according to the present invention has many advantages:

(1) Only one mask is needed to fabricate a capacitor. That is to say, one mask is needed when the upper electrode 381 is defined. The lower electrode 321 and the interconnect line 320 are in-situ (concurrently) formed. Thus, one mask is omitted compared with the conventional method. Production costs are reduced.

(2) Since the lower electrode 321 and the interconnect line 320 are located at the same level, it is easier to design circuits, and the volume of integrated circuits is conserved. In addition, there is no need to adjust the thickness of the dielectric layer and the location of the interconnect for the additional capacitor as in the conventional method.

(3) When the first and second via holes 401 and 400 are defined, since the etching heights for these two via holes differ a little, etching is easy to conduct, which decreases the complexity of the process.

(4) The method of the present invention can effectively protect the upper and lower electrodes from the effects of subsequent etching. Thus, the edge portion of the capacitor will not change, and the electrode surface is easily controlled.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A capacitor, comprising:
   a first conductive line and a second conductive line on a substrate located at the same level, wherein the second conductive line defines a capacitor region and is used as a lower electrode of the capacitor;
   an insulating layer on the substrate, the first conductive line, and the second conductive line;
   a third conductive line on the insulating layer in the capacitor region such that the third conductive line is used as an upper electrode of the capacitor;
   a dielectric layer on the upper electrode and the insulating layer, wherein the dielectric layer has a first via hole reaching the first conductive line and a second via hole reaching the upper electrode;
   a first metal plug filled in the first via hole; and
   a second metal plug filled in the second via hole.

2. The capacitor as claimed in claim 1, wherein the first and second conductive lines are metal.

3. The capacitor as claimed in claim 1, wherein the first and second conductive lines are polysilicon.

4. The capacitor as claimed in claim 1, wherein the upper electrode is metal.

5. The capacitor as claimed in claim 1, wherein the upper electrode is polysilicon.

6. The capacitor as claimed in claim 1, wherein the insulating layer is made of a material of SiN, SiON, SiC, $TaO_2$, $TiO_2$, $ZrO_2$, $HfO_2$, or $Al_2O_3$ formed by chemical vapor deposition (CVD).

7. The capacitor as claimed in claim 1, wherein the dielectric layer is a silicon oxide layer formed by CVD.

8. The capacitor as claimed in claim 1, wherein the first and second metal plugs are tungsten plugs.

9. The capacitor as claimed in claim 1, wherein the first metal plug includes a barrier layer on interior walls of the first via hole and a tungsten plug filled in the first via hole, and the second metal plug includes a barrier layer on interior walls of the second via hole and a tungsten plug filled in the second via hole.

10. The capacitor as claimed in claim 1, further comprising:
    a fourth conductive line on the first plug; and
    a fifth conductive line on the second plug,
    wherein the fourth and fifth conductive lines are located at the same level.

11. The capacitor as claimed in claim 2, wherein the first and second conductive lines are aluminum, copper, or an aluminum alloy.

12. The capacitor as claimed in claim 4, wherein the upper electrode is made of Ti, TiN, Ta, TaN, Al, or AlCu.

13. The capacitor as claimed in claim 9, wherein the barrier layer is Ti/TiN or TiW formed by sputtering.

14. The capacitor as claimed in claim 10, wherein the fourth and fifth conductive lines are made of aluminum, copper, or an aluminum alloy.

15. A capacitor, comprising:
    a first conductive line and a second conductive line on a substrate located at the same level, wherein the second conductive line defines a capacitor region and is used as a lower electrode of the capacitor;
    an insulating layer on the substrate, the first conductive line, and the second conductive line;
    a third conductive line on the insulating layer in the capacitor region such that the third conductive line is used as an upper electrode of the capacitor;
    a dielectric layer on the upper electrode and the insulating layer, wherein the dielectric layer has a first via hole reaching the first conductive line and a second via hole reaching the upper electrode;
    a first metal plug filled in the first via hole;
    a second metal plug filled in the second via hole;
    a fourth conductive line on the first plug; and
    a fifth conductive line on the second plug,
    wherein the fourth and the fifth conductive lines are located at the same level.

* * * * *